United States Patent
Van Cleemput et al.

(10) Patent No.: US 6,340,628 B1
(45) Date of Patent: Jan. 22, 2002

(54) METHOD TO DEPOSIT SIOCH FILMS WITH DIELECTRIC CONSTANT BELOW 3.0

(75) Inventors: Patrick A. Van Cleemput, Sunnyvale; Ravi Kumar Laxman, San Jose; Jen Shu, Saratoga; Michelle T. Schulberg, Palo Alto; Bunsen Nie, Fremont, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/735,318

(22) Filed: Dec. 12, 2000

(51) Int. Cl.⁷ .................. H01L 21/3205; H01L 21/31
(52) U.S. Cl. .................. 438/586; 438/748; 438/280
(58) Field of Search .................. 438/586, 587, 438/748, 780, 781, 789, 790; 427/166, 529; 204/192.1

(56) References Cited

U.S. PATENT DOCUMENTS

| | | | | |
|---|---|---|---|---|
| 4,002,512 A | * | 1/1977 | Lim | 148/187 |
| 4,902,307 A | * | 2/1990 | Gavalas et al. | 55/16 |
| 5,246,734 A | * | 9/1993 | Varaprath et al. | 427/166 |
| 5,447,613 A | * | 9/1995 | Ouellet | 204/192.1 |
| 5,457,073 A | * | 10/1995 | Ouellet | 437/223 |
| 5,543,945 A | * | 8/1996 | Kimura et al. | 359/55 |
| 5,789,024 A | * | 8/1998 | Levy et al. | 427/244 |
| 5,858,065 A | * | 1/1999 | Li et al. | 95/45 |
| 6,074,698 A | * | 6/2000 | Sakuria et al. | 427/307 |
| 6,245,690 B1 | * | 6/2001 | Yau et al. | 438/780 |

* cited by examiner

*Primary Examiner*—Michael Lebentritt
(74) *Attorney, Agent, or Firm*—Skjerven Morrill MacPherson LLP; Tom Chen

(57) ABSTRACT

A chemical vapor deposition (CVD) process uses a precursor gas, such as with a siloxane or alkylsilane, and a carbon-dioxide-containing gas, such as $CO_2$ with $O_2$ or $CO_2$ with $C_xH_{(2x+1)}OH$ where $1 \leq x \leq 5$, to deposit a dielectric layer with no photoresist "footing", a low dielectric constant, and high degrees of adhesion and hardness. Because nitrogen is not used in the deposition process (the carbon-dioxide-containing gas replaces nitrogen-containing gases in conventional processes), amines do not build into the deposited layer, thereby preventing photoresist "footing".

22 Claims, No Drawings

METHOD TO DEPOSIT SIOCH FILMS WITH DIELECTRIC CONSTANT BELOW 3.0

BACKGROUND

1. Field of Invention

The present invention relates to semiconductor processing, and in particular, to deposition of dielectric films.

2. Related Art

Integrated circuits fabricated on semiconductor substrates for very large scale integration typically require multiple levels of metal layers to electrically interconnect the discrete layers of semiconductor devices on the semiconductor chips. The different levels of metal layers are separated by various insulating or dielectric layers (also known as interlevel dielectric (ILD) layers), which have etched via holes to connect devices or active regions from one layer of metal to the next. The individual metal and ILD layers can be deposited by conventional chemical vapor deposition (CVD) techniques, such as high density plasma (HDP) CVD, plasma enhanced CVD (PECVD), or low pressure CVD. Typical dielectric materials for the ILD layer include silicon oxides, silicon nitrides, and silicon oxynitrides.

Current CVD processes typically utilize nitrous oxide ($N_2O$) or $O_2$ as an oxidizing gas and $N_2$ as a balance or carrier gas in forming an ILD layer. Suitable precursor gases for such layers include multiple siloxanes, such as, but not limited to, tetramethyldisiloxane (TMDSO), tetramethylcyclotetrasiloxane (TMCTS), and octamethylcyclotetrasiloxane (OMCTS). Other suitable precursor gases include alkylsilanes, such as 3MS, 4MS, and PTMS.

When $N_2O$ as an oxidizing gas or $N_2$ as a balance gas is used, unwanted nitrogen can build into the deposited films or layers, resulting in amines ($NH_2$ groups) formed on the surface of the film or layer. These amines cause photoresist "footing" when exposing the photoresist with deep ultraviolet (DUV) light, as discussed in more detail below.

As semiconductor technology advances, circuit elements and dimensions on wafers or silicon substrates are becoming increasingly more dense. Consequently, the interconnections between various circuit elements and dielectric layers also need to be reduced. Interconnections and other patterns are formed by etching specific portions of the metal and/or dielectric layer to electrically disconnect or connect active regions.

Typically, a photoresist layer of photo-reactive polymeric material is deposited over the layer to be patterned or etched. Light such as visible, ultraviolet (UV), or deep UV (DUV) light is directed through a mask onto the photoresist layer to expose the photoresist and transfer the mask pattern thereon. However, as feature sizes continue to decrease, the shorter wavelength light radiation is used to expose the resist. Whereas "I-line" radiation having a wavelength of 365 nm has been the standard, DUV radiation having a wavelength of 248 nm or less is now being used more frequently.

The exposure of photoresists that are used with deep UV radiation generally creates an acidic reaction in the photoresist. The resulting acidic compounds then react with the developer to create a mask. Since the amines are basic, they tend to neutralize the acids generated by the exposure of the photoresist and thereby inhibit the development of the photoresist. For example, some incident DUV light may be reflected from the underlying layer and scattered back into the photoresist, and contaminants from the underlying layer can migrate into the photoresist. As a result, when the photoresist is developed, the side walls are non-uniform (non-vertical), also known as photoresist "footing". Consequently, the pattern in the photoresist that is subsequently transferred to the underlying layer is not the desired pattern, but will have errors resulting from the photoresist footing. This is especially critical with dense patterns and smaller feature sizes.

Accordingly, it is desirable to deposit a dielectric film without the problems discussed above that are associated with conventional techniques.

SUMMARY

In the present invention, a dielectric layer or film is deposited with a chemical vapor deposition process using a $CO_2$-containing gas with a multiple siloxane or alkylsilane. The $CO_2$-containing gas can include $O_2$ or a $C_xH_{(2x+1)}OH$ compound, where $1 \leq x \leq 5$. The resulting dielectric film or layer shows no photoresist "footing" caused by amines. Furthermore, the deposited layer has a low dielectric constant (e.g., k<3.0) and high adhesion and hardness properties.

The siloxane or alkylsilane flow is between 0.5 and 10 ml/min., and the $CO_2$ flow is between 500 and 5000 sccm. The deposition pressure is between 0.2 and 10 Torr, the deposition temperature between 25 and 425° C., the high frequency RF power between 150 and 2000 W. and the low frequency RF power between 0 and 500 W.

In one embodiment, the flow rate of $O_2$ is between 25 and 500 sccm, and in another embodiment, the flow rate of $C_xH_{(2x+1)}OH$ is between 50 and 500 sccm. Both embodiments produce films with dielectric constants less than or equal to 2.8, hardness of 0.5 to 1.0 GPa, and adhesion of 2 to 6 kpsi.

The present invention will be more fully understood when taken in light of the following detailed description.

DETAILED DESCRIPTION OF THE PREFERRED EMBODIMENTS

In accordance with the present invention, a low dielectric constant film or layer is deposited using a chemical vapor deposition (CVD) process without nitrogen-containing gases, such as $N_2$ or $N_2O$. The nitrogen-containing gases are replaced by $CO_2$ combined with either oxygen ($O_2$) or alcohol ($C_xH_{(2x+1)}OH$), where $1 \leq x \leq 5$. Dielectric layers formed with the present invention do not exhibit photoresist footing, while still having a low dielectric constant and high adhesion and hardness properties.

In one embodiment, a plasma enhanced CVD (PECVD) process with $CO_2$ and $O_2$ as a balance gas is utilized to deposit the dielectric layer. The precursor gas can be multiple siloxanes, such as, but not limited to, OMCTS, TMCTS, TMDSO, and TMDDSO, or alkylsilanes, such as, but not limited to, 3MS, 4MS, and PTMS. Table 1 below provides values and ranges of values for various process parameters according to one embodiment.

TABLE 1

| Parameter | Value | Range |
| --- | --- | --- |
| Siloxane flow | 5 ml/min. | 0.5–10 ml/min. |
| $CO_2$ flow | 2500 sccm | 500–5000 sccm |
| $O_2$ flow | 125 sccm | 25–500 sccm |
| Dep. Pressure | 4 Torr | 0.2–10 Torr |
| Dep. Temp. | 400° C. | 25–425° C. |

TABLE 1-continued

| Parameter | Value | Range |
|---|---|---|
| HF RF Power | 1500 W | 150–2000 W |
| LF RF Power | 250 W | 0–500 W |

The actual values used will depend on a variety of factors, such as the type of layer formed, the size of the wafer, and the deposition process.

Table 2 below shows comparative values and ranges of values for dielectric constant k, hardness, and adhesion using the process described in Table 1 and a conventional process using nitrogen described in Table 3.

TABLE 2

| | $CO_2/O_2$ Process | | $N_2O$ process | |
|---|---|---|---|---|
| Parameter | Value | Range | Value | Range |
| K | ≦2.8 | | ≦3.0 | |
| Hardness | 0.8 GPa | 0.5–1.0 GPa | 0.4 GPa | 0.2–0.6 GPa |
| Adhesion | 3 kpsi | 2–6 kpsi | 1 kpsi. | 1–3 kpsi |

TABLE 3

| Parameter | Value | Range |
|---|---|---|
| Siloxane flow | 5 ml/min. | 0.5–10 ml/min. |
| $N_2O$ flow | 2500 sccm | 500–5000 sccm |
| Dep. Pressure | 4 Torr | 0.2–10 Torr |
| Dep. Temp. | 400° C. | 25–425° C. |
| HF RF Power | 1500 W | 150–2000 W |
| LF RF Power | 250 W | 0–500 W |

As seen from Tables 1 and 3, the process parameters are the same, except that $N_2O$ is replaced with $CO_2$ and $O_2$. However, as a result, whereas the layer deposited with $N_2O$ exhibits photoresist footing due to amines (i.e., $NH_2$ groups), the dielectric layer deposited with $CO_2$ and $O_2$ does not show this "footing" problem because there is no longer unwanted nitrogen to build into the deposited layer. Further, as seen from Table 2, the dielectric film deposited according to the present invention has a lower dielectric constant k and higher degrees of hardness and adhesion.

It is desirable for the insulating layer to have a low dielectric constant, especially when spacing between conductive elements become smaller. Low-k insulating layers can effectively isolate metal lines from each other and reduce the conductor layer parasitic capacitance and conductor layer cross-talk of the device that is formed and increase the speed of the device.

In another embodiment, an alcohol, such as methanol, and carbon dioxide replaces $N_2O$ or $N_2$ for CVD deposition of a dielectric layer using multiple siloxanes or alkylsilanes as a precursor gas. The alcohol compound is given by $C_xH_{(2x+1)}OH$, where x is between 1 and 5, inclusive. This embodiment differs from the above in that $C_xH_{(2x+1)}OH$ replaces $O_2$. Table 4 below lists values and ranges of values for various process parameters for this embodiment.

TABLE 4

| Parameter | Value | Range |
|---|---|---|
| Siloxane flow | 5 ml/min. | 0.5–10 ml/min. |
| $CO_2$ flow | 2500 sccm | 500–5000 sccm |
| $C_xH_{(2x+1)}OH$ | 250 sccm | 50–500 sccm |
| Dep. Pressure | 4 Torr | 0.2–10 Torr |
| Dep. Temp. | 400° C. | 25–425° C. |
| HF RF Power | 1500 W | 150–2000 W |
| LF RF Power | 250 W | 0–500 W |

The dielectric film or layer deposited with this process yields the same characteristics and properties as a film deposited according to the embodiment of Table 1. Thus, comparison values shown in Table 2 also apply to this embodiment.

The above-described embodiments of the present invention are merely meant to be illustrative and not limiting. It will thus be obvious to those skilled in the art that various changes and modifications may be made without departing from this invention in its broader aspects. For example, other deposition processes are also suitable for this invention, such as ICP and LPCVD. Therefore, the appended claims encompass all such changes and modifications as fall within the true spirit and scope of this invention.

What is claimed is:

1. A process for depositing a dielectric layer in a chemical vapor deposition (CVD) chamber, comprising:

providing a semiconductor substrate in said CVD chamber;

introducing a precursor gas into said CVD chamber;

introducing a $CO_2$-containing gas into said CVD chamber; and depositing said dielectric layer using a CVD process at a deposition temperature of approximately 425° or less.

2. The process of claim 1, wherein said $CO_2$-containing gas comprises $CO_2$ and $O_2$.

3. A process for depositing a dielectric layer in a chemical vapor deposition (CVD) chamber, comprising:

providing a semiconductor substrate in said CVD chamber;

introducing a precursor gas into said CVD chamber;

introducing a $CO_2$-containing gas into said CVD chamber, wherein said $CO_2$-containing gas comprises $CO_2$ and $C_xH_{(2x+1)}OH$, wherein 1<x<5; and depositing said dielectric layer using a CVD process.

4. The process of claim 2, wherein the ratio of $CO_2$ to $O_2$ is approximately 20:1.

5. The process of claim 2, wherein the flow rate of $CO_2$ is between approximately 500 and 5000 sccm, and the flow rate of $O_2$ is between approximately 25 and 500 sccm.

6. The process of claim 3, wherein the ratio of $CO_2$ to $C_xH_{(2x+1)}OH$ is approximately 10:1.

7. The process of claim 3, wherein the flow rate of $CO_2$ is between approximately 500 and 5000 sccm, and the flow rate of $C_xH_{(2x+1)}OH$ is between approximately 50 nd 500 sccm.

8. A process for depositing a dielectric layer in a chemical vapor deposition (CVD) chamber, comprising:

providing a semiconductor substrate in said CVD chamber;

introducing a precursor gas into said CVD chamber, wherein the precursor gas is a siloxane or alkylsilane;

introducing a $CO_2$-containing gas into said CVD chamber; and depositing said dielectric layer using a CVD process.

9. A process for forming a dielectric layer over a semiconductor substrate, comprising:

providing a gas mixture comprised of a precursor gas and a $CO_2$-containing gas; and depositing said dielectric layer by using said gas mixture in a chemical vapor deposition process at a deposition temperature of approximately 425° or less.

10. The process of claim 9, wherein said $CO_2$-containing gas comprises $CO_2$ and $O_2$.

11. A process for forming a dielectric layer over a semiconductor substrate, comprising:

providing a gas mixture comprised of a precursor gas and a $CO_2$-containing gas, wherein said $CO_2$-containing gas comprises $CO_2$ and $C_xH_{(2x+1)}OH$, wherein $1<x<5$; and depositing said dielectric layer by using said gas mixture in a chemical vapor deposition process.

12. The process of claim 10, wherein the ratio of $CO_2$ to $O_2$ is approximately 20:1.

13. The process of claim 10, wherein the flow rate of $CO_2$ is between approximately 500 and 5000 sccm, and the flow rate of $O_2$ is between approximately 25 and 500 sccm.

14. The process of claim 11, wherein the ratio of $CO_2$ to $C_xH_{(2x+1)}OH$ is approximately 10:1.

15. The process of claim 11, wherein the flow rate of $CO_2$ is between approximately 500 and 5000 sccm, and the flow rate of $C_xH_{(2x+1)}OH$ is between approximately 50 and 500 sccm.

16. A process for forming a dielectric layer over a semiconductor substrate, comprising:

providing a gas mixture comprised of a precursor gas and a $CO_2$-containing gas, wherein the precursor gas is a siloxane or alkylsilane; and depositing said dielectric layer by using said gas mixture in a chemical vapor deposition process.

17. The process of claim 8, wherein said $CO_2$-containing gas comprises $CO_2$ and $O_2$.

18. The process of claim 17, wherein the ratio of $CO_2$ to $O_2$ is approximately 20:1.

19. The process of claim 17, wherein the flow rate of $CO_2$ is between approximately 500 and 5000 sccm, and the flow rate of $O_2$ is between approximately 25 and 500 sccm.

20. The process of claim 16, where said $CO_2$-containing gas comprises $CO_2$ and $O_2$.

21. The process of claim 20, wherein the ratio of $CO_2$ to $O_2$ is approximately 20:1.

22. The process of claim 20, wherein the flow rate of $CO_2$ is between approximately 500 and 5000 sccm, and the flow rate of $O_2$ is between approximately 25 and 500 sccm.

* * * * *